United States Patent
Erdim et al.

(10) Patent No.: US 12,198,270 B2
(45) Date of Patent: Jan. 14, 2025

(54) MODELING SYSTEM FOR 3D VIRTUAL MODEL

(71) Applicant: The Boeing Company, Chicago, IL (US)

(72) Inventors: Huseyin Erdim, Kirkland, WA (US); Paul Zack Thunemann, Seattle, WA (US)

(73) Assignee: The Boeing Company, Arlington, VA (US)

( * ) Notice: Subject to any disclaimer, the term of this patent is extended or adjusted under 35 U.S.C. 154(b) by 99 days.

(21) Appl. No.: 17/929,531

(22) Filed: Sep. 2, 2022

(65) Prior Publication Data

US 2024/0078752 A1 Mar. 7, 2024

(51) Int. Cl.
*G06T 17/10* (2006.01)
*G06T 7/64* (2017.01)
*G06T 17/30* (2006.01)

(52) U.S. Cl.
CPC .......... *G06T 17/10* (2013.01); *G06T 7/64* (2017.01); *G06T 17/30* (2013.01); *G06T 2210/12* (2013.01)

(58) Field of Classification Search
None
See application file for complete search history.

(56) References Cited

U.S. PATENT DOCUMENTS

| 2013/0124149 A1 | 5/2013 | Carr et al. |
| 2014/0184599 A1* | 7/2014 | Quilot .................... G06T 17/10 345/423 |

OTHER PUBLICATIONS

Daniels, J. II et al., "Robust Smooth Feature Extraction from Point Clouds," Proceedings of the IEEE International Conference on Shape Modeling and Applications (SMI'07), Jun. 13, 2007, Lyon, France, 11 pages.
European Patent Office, Extended European Search Report Issued in Application No. 23188210.1, Jan. 25, 2024, Germany, 16 pages.

* cited by examiner

*Primary Examiner* — Nurun Flora
(74) *Attorney, Agent, or Firm* — Alleman Hall & Tuttle LLP

(57) ABSTRACT

A modeling system is provided which retrieves from memory the 3D virtual model of an object; extract an outer surface of the 3D virtual model, the outer surface including a plurality of faces; identify feature curves in each of the plurality of faces of the outer surface; generate a parameterized surface from the identified feature curves; and output the feature curves and the parameterized surface. The system may generate a list of feature curve pairs that are adjacent to one another; obtain face pairs corresponding to the feature curve pairs; obtain and add a list of faces in the outer surface to a connectivity graph mapping points in 3D space to the feature curves; for each pair of connected faces, evaluate whether an angle difference between normals of the connected faces is greater than a threshold; and then extract a feature curve based on the pair of connected faces.

18 Claims, 7 Drawing Sheets

MODELING SYSTEM FOR 3D VIRTUAL MODEL

FIELD

The field of the present disclosure relates generally to modeling systems and, more specifically, to systems and methods of adaptively fitting a three-dimensional (3D) model.

BACKGROUND

Modern manufacturing applies 3D modeling in a wide variety of applications to accurately model manufacturing objects of various sizes and shapes. One widely used technique of 3D virtual modeling is a polygon mesh, which uses a collection of vertices, edges, and faces to define the shape of a polyhedral object. Although polygon meshes are often used for objects with curved surfaces, modeling objects with relatively complicated shapes using polygon meshes, especially with sharp features, can lead to a model with an excessive number of control points that do not accurately track the curved features of the object.

SUMMARY

In view of the above, a modeling system is provided, including at least one processor, communicatively coupled to non-volatile memory storing a three-dimensional (3D) computer-aided design (CAD) model and instructions that, when executed by the processor, cause the processor to retrieve a 3D CAD model of an object; extract an outer surface of the 3D CAD model, the outer surface including a plurality of faces; extract feature curves from each of the plurality of faces of the outer surface; generate a parameterized surface from the generated feature curves; and output the feature curves and the parameterized surface.

The features, functions, and advantages that have been discussed can be achieved independently in various embodiments or can be combined in yet other embodiments further details of which can be seen with reference to the following description and drawings.

DETAILED DESCRIPTION

Figure 1:
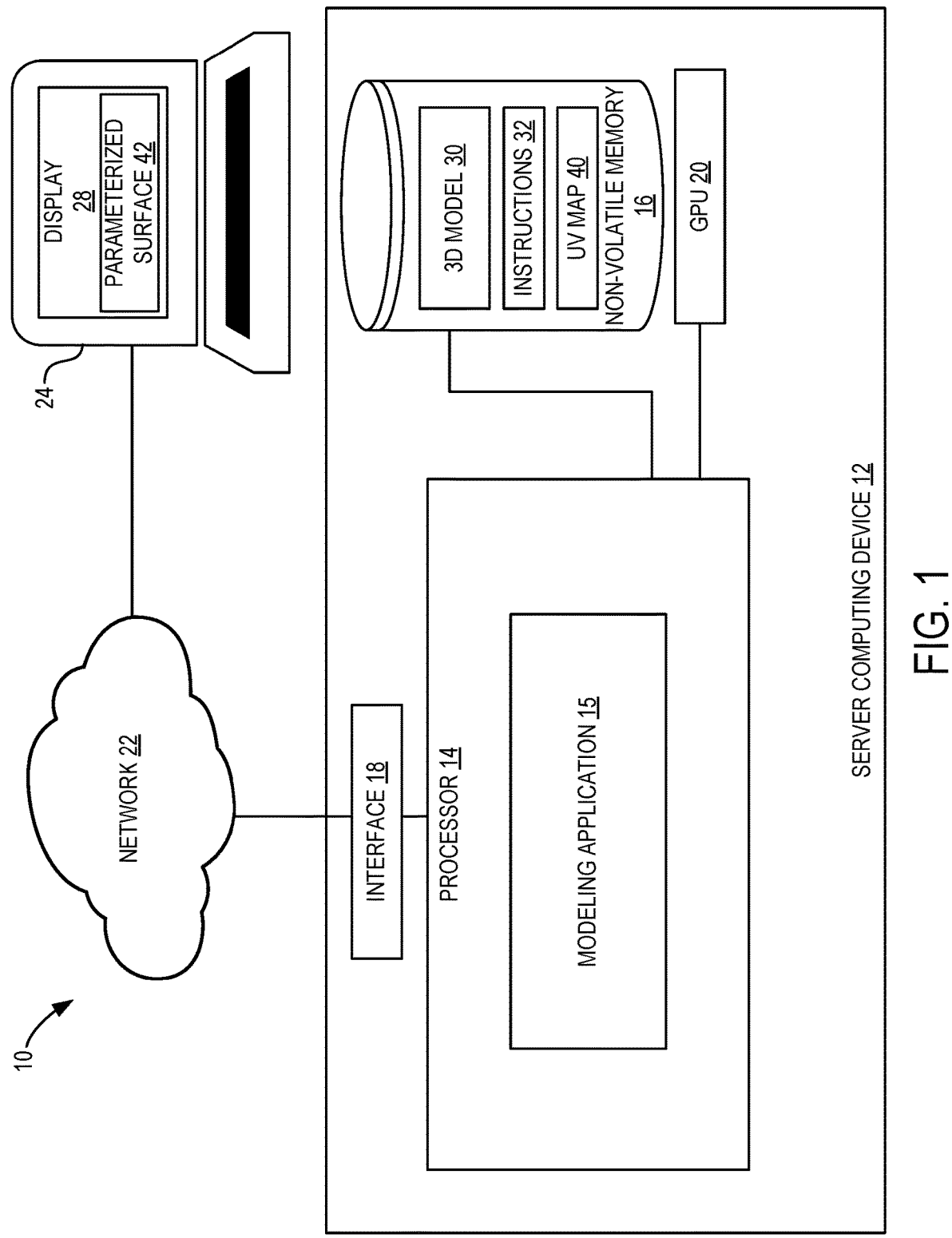
FIG. 1 is a general schematic diagram illustrating an overview of a modeling system according to an example of the subject disclosure.

In view of the above issues, as shown in FIG. 1, a schematic diagram of a modeling system 10 is depicted comprising a server computing device 12 which includes one or more processors 14, which can be communicatively coupled to a network 22. The server computing device 12 further comprises non-volatile memory 16 storing a three-dimensional (3D) virtual model 30 and instructions 32 that, when executed by the processor 14, cause the processor 14 to retrieve the 3D virtual model 30 from the non-volatile memory 16. The 3D virtual model 30 can be of an aircraft or an aircraft component, or other manufactured parts or components, for example, as illustrated in FIG. 8. The sizes of the 3D virtual model 30 are not particularly limited—the 3D virtual model 30 can be of micron-scale objects in such applications as printed circuit boards or medical devices, or of over-sized objects.

The 3D virtual model 30 is the mathematical representation of the surface geometry of an object, so that computer-rendered images of the object can be created from any angle. The 3D virtual model 30 can be a polygon mesh model.

The non-volatile memory 16 can further store a U-V mapping 40, onto which one or more feature curves of the 3D virtual model 30 can be projected to produce a plurality of two dimensional curves (U-V curves). The U-V mapping is a parameterized surface and can be a piecewise polynomial mapping, such as a tensor product spline, between a two-dimensional rectangular parameter domain and three-dimensional space.

The server computing device 12 includes a network interface 18 to affect the communicative coupling to the network 22 and, through the network 22, a client computing device 24. The client computing device 24 comprises a display 28 which is configured to display a parameterized surface 42 which is outputted by the server computing device 12. Network interface 18 can include a physical network interface, such as a network adapter.

The server computing device 12 can be a special-purpose computer, adapted for reliability and high-bandwidth communications. Thus, the system 10 can be embodied in a cluster of individual hardware server computers, for example. The processor 14 can be multi-core processors suitable for handling large amounts of information. The processor 14 is communicatively coupled to non-volatile memory 16 storing a 3D virtual model 30, U-V mapping 40, and instructions 32 which can be executed by the processor 14 to effectuate the techniques disclosed herein on concert with the client computing device 24 as shown and described below. The non-volatile memory 16 can be in a Redundant Array of Inexpensive Disk drives (RAID) configuration for added reliability. The processor 14 can also be communicatively coupled to graphical co-processors (GPU) 20. Graphical co-processors 20 can expedite the technique disclosed herein by performing operations in parallel.

The processor 14 is configured to execute a modeling application 15. The modeling application 15 is configured to retrieve a 3D virtual model 30 of an object from the non-volatile memory 16, define a parameter domain, parameterize the 3D virtual model 30 over the parameter domain to thereby extract an outer surface of the 3D virtual model 30, the outer surface including a plurality of faces, identify feature curves and bounding boxes in each of the plurality of faces of the outer surface, generate a parameterized surface 42 from the identified feature curves, and output the feature curves and the parameterized surface 42.

Figure 2:
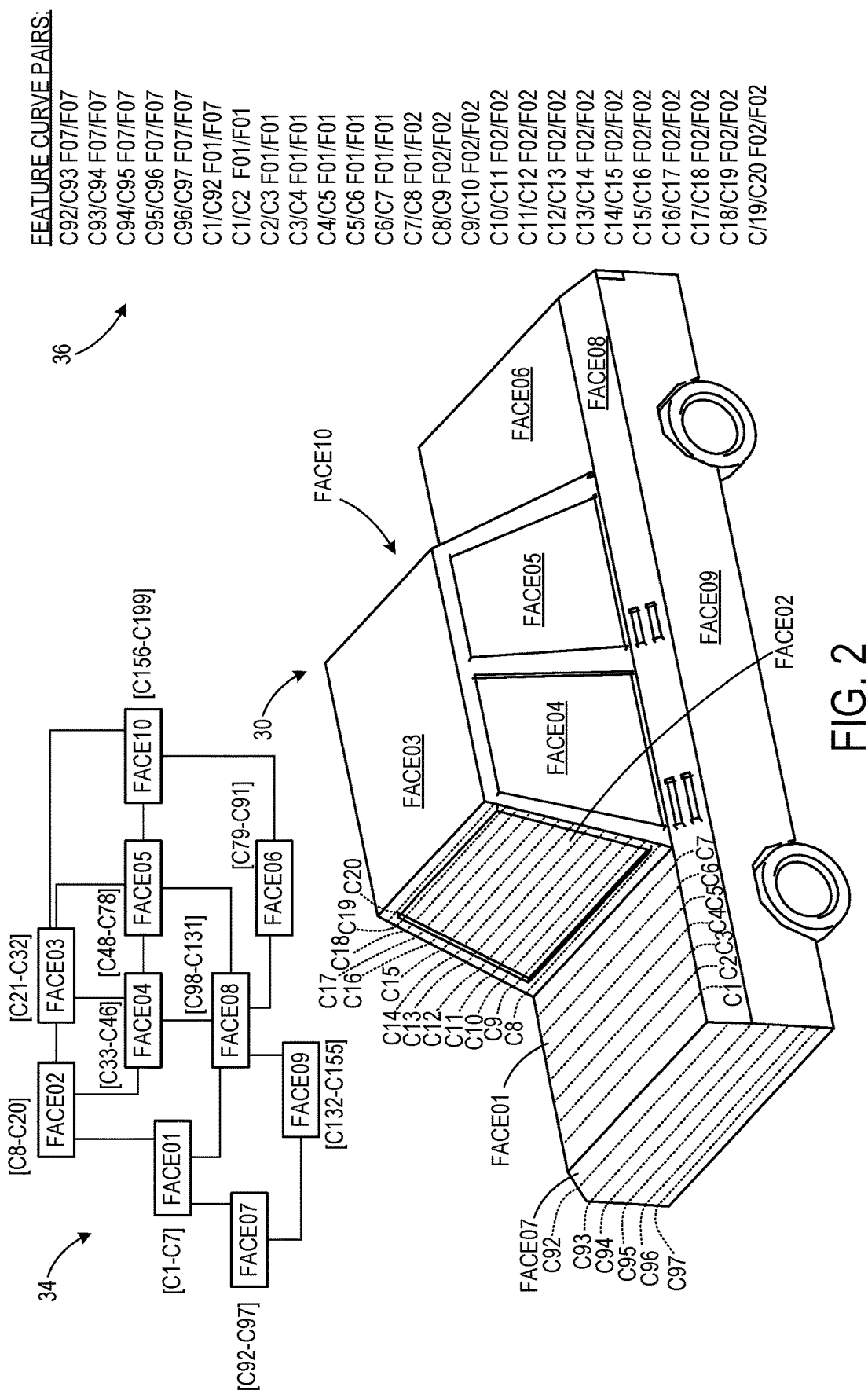
FIG. 2 is an illustration of a connectivity graph for obtaining a parameterized surface, according to an example of the subject disclosure.

FIG. 2 shows an illustration of a connectivity graph 34 which maps points in 3D space to the feature curves. Here, a 3D virtual model 30 of a toy car is shown with faces FACE01-FACE10 extracted as an outer surface of the 3D virtual model 30. The connectivity graph 34 shows the connectivity of the different faces to each other. The connectivity graph 34 can be a connectivity tree or graph mapping the feature curves to the plurality of faces, and mapping points in the 3D space to the feature curves.

In this example, the connectivity graph 34 shows that FACE01 is connected to FACE02, FACE07, and FACE08. The feature curves extracted or identified in each face are also shown. For example, FACE01 is shown to have feature curves C1 through C7, while FACE07 is shown to have feature curves C92 through C97. In some configurations, only feature curves with arc lengths that are longer than a predetermined minimum length can be extracted.

To build the connectivity graph, a list 36 is generated of feature curve pairs that are proximate or adjacent to one another, which is subsequently used by the modeling application 15 to build a connectivity graph 34 mapping points in 3D space to the feature curves. To generate the list 36, nearby points can be found for each point in each feature curve using a spatial indexing scheme, which contains data about the relative proximities of the feature curves to each other. The spatial indexing scheme can be configured as an RTREE, for example. The corresponding curve is found for each nearby point to obtain a set of unique nearby feature curves. To further refine the list 36, additional computations can be performed to determine whether two feature curves among the unique nearby feature curves are proximate or adjacent to each other. This can be done by calculating geometric distance, for example, using a distance function, and determining that the approximate Hausdorff distance between the two feature curves is less than a predetermined threshold distance. Responsive to determining that the two curves are proximate or adjacent to each other, the feature curve pair is appended to the list 36 of feature curve pairs, thereby generating a list 36 of feature curve pairs that are proximate or adjacent to one another.

Alternatively or additionally, a principal axis of each feature curve can be calculated. It can be determined whether principal directions of the principal axes of the feature curves of the feature curve pair are aligned within a predetermined angle threshold. Responsive to determining that the principal directions of the principal axes of the feature curves of the feature curve pair are aligned within the predetermined angle threshold, the feature curve pair can be added to the list 36 of feature curve pairs that are adjacent to one another.

Alternatively or additionally, midpoints and end points of each feature curve can be projected. It can be determined whether the midpoints and the end points are separated within a predetermined distance. Responsive to determining that the midpoints and the end points are separated within the predetermined distance, the feature curve pair can be added to the list 36 of feature curve pairs that are adjacent to one another. The predetermined distance can be half a difference between the arc lengths of the feature curves of the feature curve pair, for example.

Figure 3:
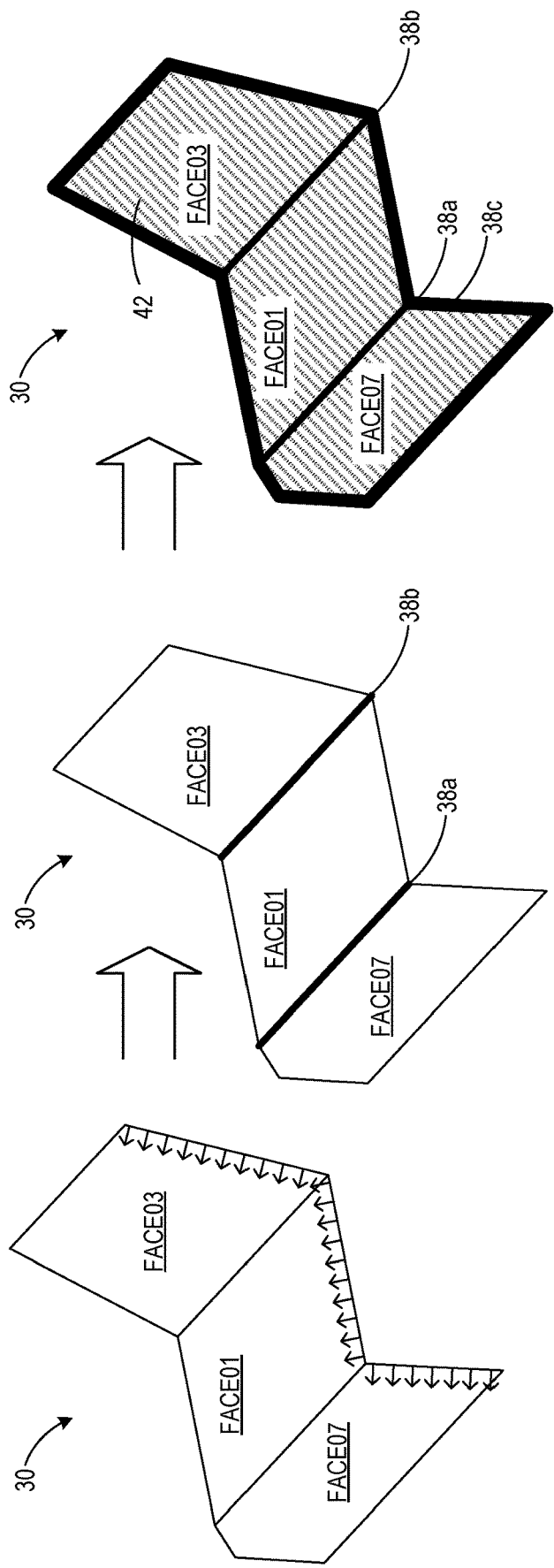
FIG. 3 is an illustration of the process of obtaining features, boundaries, and a parameterized surface on a 3D virtual model, according to an example of the subject disclosure.

Alternatively or additionally, referring to FIG. 3, the process of extracting features from the 3D virtual model 30 via the connectivity graph is schematically illustrated for three of the faces: face 01, face 03, and face 07. The small arrows on each of the three faces represent normals of each face. The normals of the connected faces are compared, and added as a feature if the angle difference between the normals is greater than a predetermined threshold. The predetermined threshold may be set between 45 to 90 degrees, for example. Here, the angle difference between the normals of face 01 and face 07 is determined to be greater than a predetermined threshold, so a first feature 38a is extracted between face 01 and face 07. Likewise, the angle difference between the normals of face 01 and face 03 is determined to be greater than a predetermined threshold, so a second feature 38b is extracted between face 01 and face 03. Boundaries 38c around the faces 01, 03, 07 are subsequently extracted. When missing faces are detected, the faces are added, and the connectivity graph is updated.

For each feature curve pair in the list 36, the two faces corresponding to the feature curve pair are obtained, and the two faces are added to the connectivity graph 34. For example, the two faces corresponding to feature curves C7 and C8 are identified as face 01 and face 02, respectively. Likewise, the two faces corresponding to feature curves C1 and C92 are identified as face 01 and face 07, respectively. Accordingly, the modeling application 15 obtains face pairs corresponding to the feature curve pairs to obtain a list 36 of faces in the outer surface of the 3D virtual model 30, and then adds this list 36 of faces to the connectivity graph 34.

The list of features is subsequently outputted. The features 38a, 38b can be organized and the curves joined into single features. A parameterized surface 42 can be generated from the generated feature curves. The feature curves C1-C199 and the parameterized surface 42 are subsequently outputted.

Figure 4A:
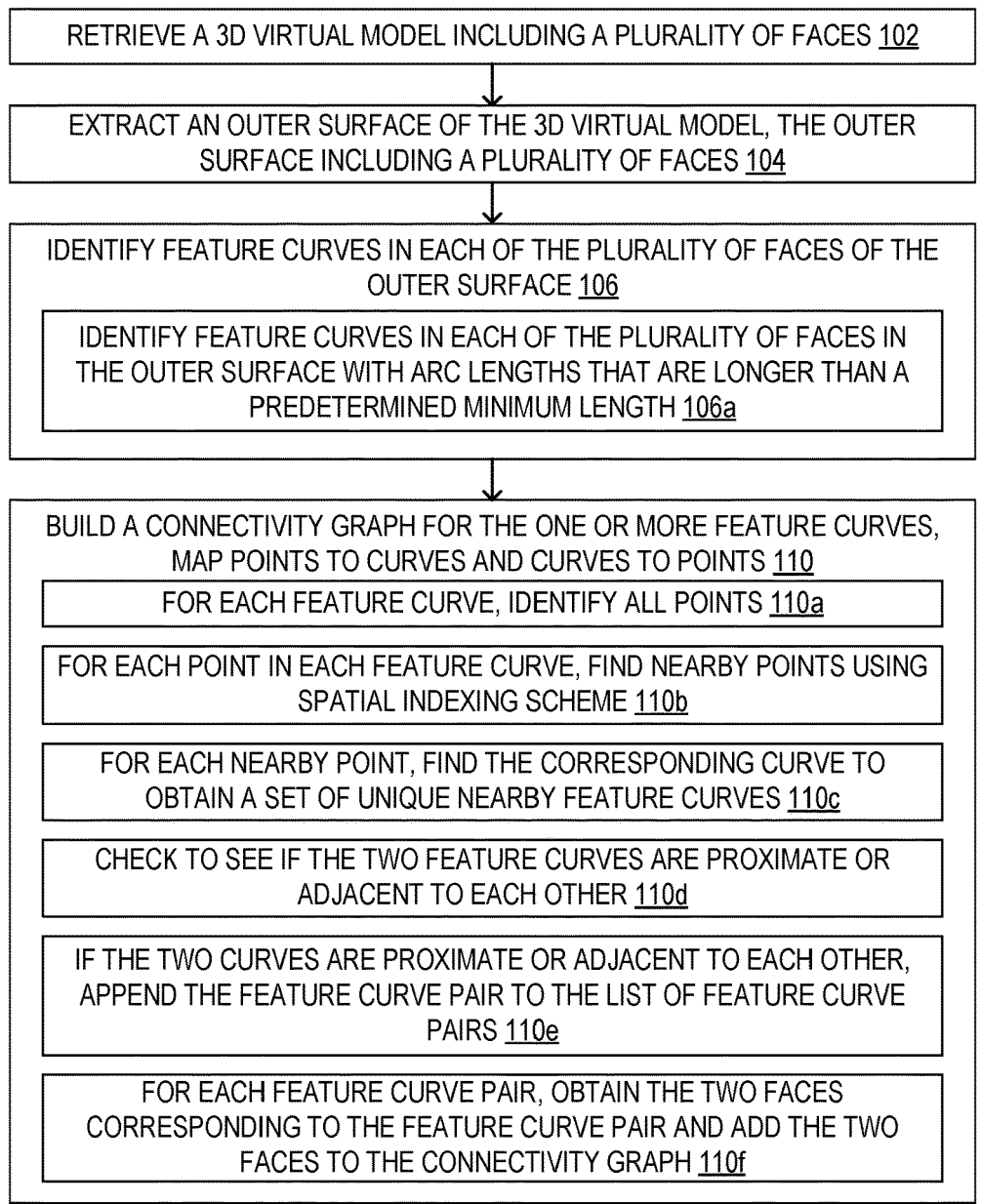
FIGS. 4A and 4B are a flowchart of a modeling method according to an example of the subject disclosure.
Figure 4B:
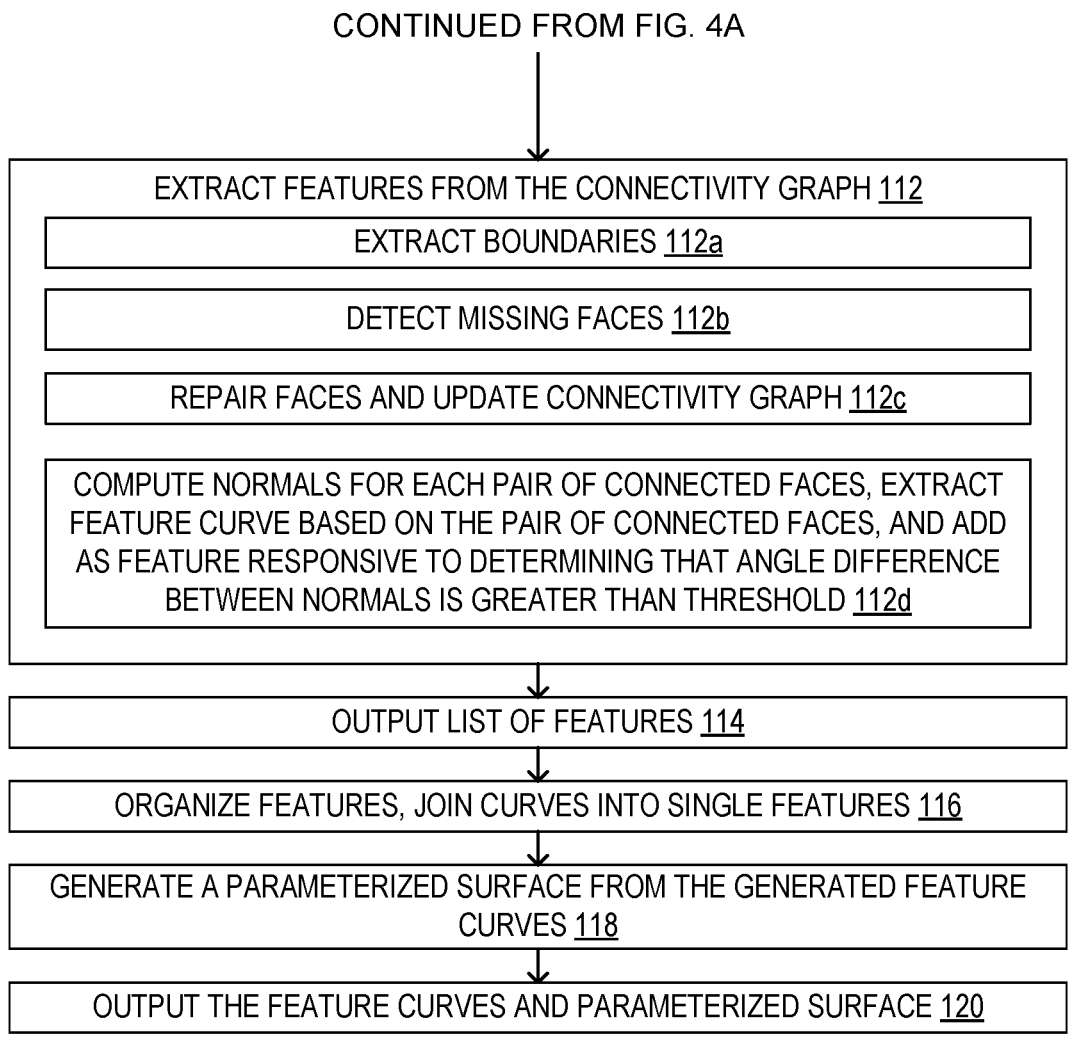

FIGS. 4A and 4B show an exemplary modeling method 100 according to an example of the present disclosure. The following description of method 100 is provided with reference to the software and hardware components described above and shown in FIGS. 1 through 3. It will be appreciated that method 100 also can be performed in other contexts using other suitable hardware and software components.

At step 102, a 3D virtual model is retrieved. At step 104, an outer surface of the 3D virtual model is extracted, the outer surface including a plurality of faces. At step 106, feature curves in each of the plurality of faces of the outer surface are identified. Step 106 can include a step 106a of identifying feature curves in each of the plurality of faces of the outer surface with arc lengths that are longer than a predetermined minimum length.

At step 110, a connectivity graph is built for the one or more feature curves, which maps points in 3D space to the feature curves. Step 110 can include steps 110a-f. At step 110a, all points are identified for each feature curve. At step 110b, nearby points are found for each point in each feature curve using a spatial indexing scheme. At step 110c, the corresponding curve is found for each nearby point to obtain a set of unique nearby feature curves. Step 110d determines whether two feature curves among the unique nearby feature curves are proximate or adjacent to each other. This can be done by calculating geometric distance, for example, using a distance function, and determining that the approximate Hausdorff distance between the two feature curves is less than a predetermined threshold distance. However, it will be appreciated that other additional or alternative methods can be used to identify adjacent feature curve pairs. At step 110e, responsive to determining that the two curves are proximate or adjacent to each other, the feature curve pair is appended to a list of feature curve pairs to generate the list of feature curve pairs that are proximate or adjacent to one another. At step 110f, for each feature curve, the two faces corresponding to the feature curve pair are identified to obtain face pairs corresponding to the feature curve pairs and obtain a list of faces in the outer surface, and the list of faces in the outer surface is added to the connectivity graph.

At step 112, the features are extracted from the connectivity graph. Step 112 can include steps 112a-d. At step 112a, boundaries are extracted. At step 112b, missing faces are detected. At step 112c, the faces are repaired, and the connectivity graph is updated. At step 112d, the normals for each pair of connected faces are computed and compared, evaluating whether an angle difference between normal of the connected faces is greater than a predetermined threshold. A feature curve is extracted based on the pair of connected faces, and added as a feature responsive to determining that the angle difference between the normals is greater than a threshold. At step 114, the list of features is outputted. At step 116, the features are organized, and the curves are joined into single features.

At step 118, a parameterized surface is generated from the generated feature curves. At step 120, the feature curves and the parameterized surface are outputted.

Figure 5:
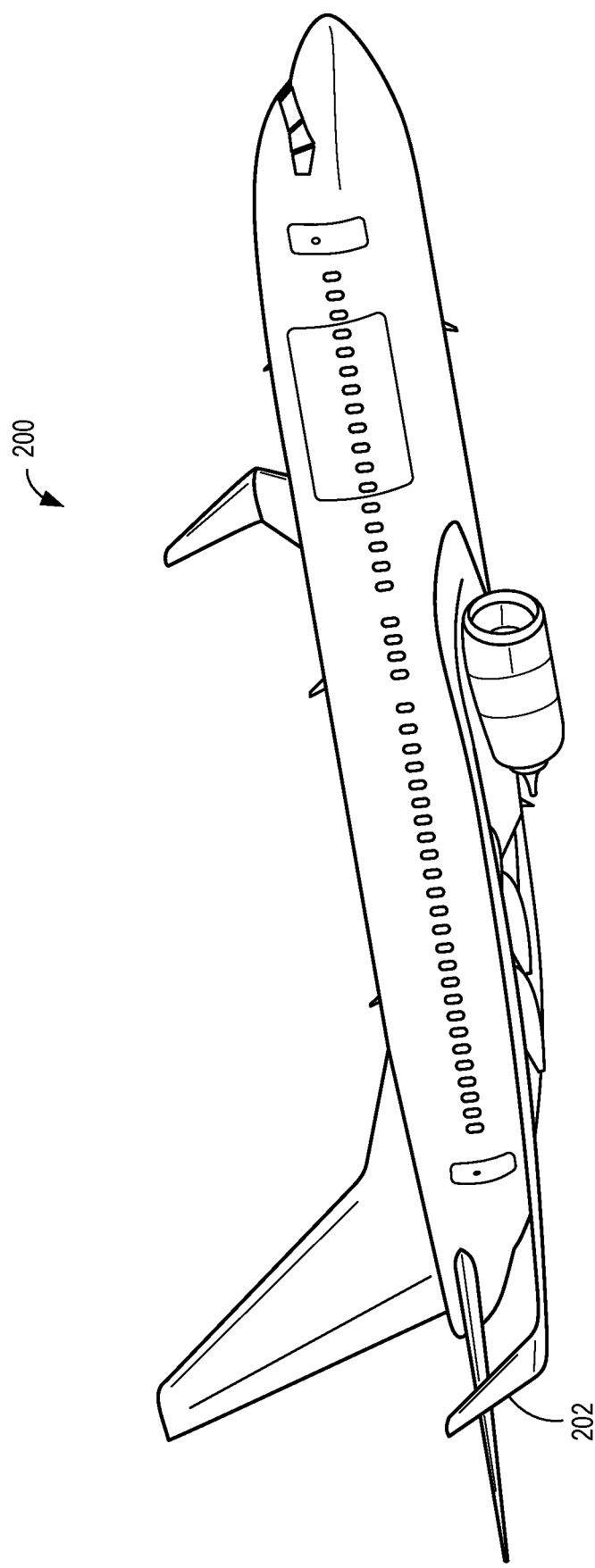
FIG. 5 is an illustration of an aircraft that can be modeled by a modeling system according to an example of the subject disclosure.

FIG. 5 is an image of an aircraft 200 according to some embodiments. It will be appreciated that the aircraft 200 or a component 202 thereof can be the object that is modeled by the 3D virtual model 30 in accordance with the system 10 and method 100 of the subject disclosure.

The systems and processes described herein have the potential benefit of building 3D parameterized surfaces that model complicated shapes accurately and efficiently without using an excessive number of control points, so that the feature curves of the 3D virtual model track the features of the 3D virtual model, including sharp edges or corners of the 3D virtual model, even on parts with complex geometric curvatures, such as wing panels of airplanes with many polygonal faces.

Thus, the 3D virtual model of the present disclosure improves accuracy. By reducing the number of control points in the 3D virtual model, the model becomes easier to work with for designers and programmers. Conventionally, designers and programmers would synthesize data represented in multiple separate geometric patches for each feature detected in the model, which was processor and memory intensive, so that the synthesized model could be input into analysis software programs. Producing a synthesized version of the patches and is a time-consuming, processor intensive, and memory intensive process. In contrast, the 3D virtual model of the present disclosure can save processor and memory resources by avoiding such laborious synthesis of separate geometries. Further, by detecting sharp feature curves on the 3D virtual model, they can be used as engineering features in computer-aided design (CAD) applications, thereby improving the technical compatibility of the model as compared to prior approaches.

The parameterized surfaces outputted by the systems and processes described herein can be used in various applications. For example, the parameterized surfaces can be used in additive manufacturing applications, for example, to optimize the weight, cost, and/or function of a 3D manufactured object through 3D model modifications. The parameterized surfaces can also be used to detect surface anomalies during inspection of the skin of manufactured or assembled parts of aircraft using three-dimensional modeling, for example.

Figure 6:
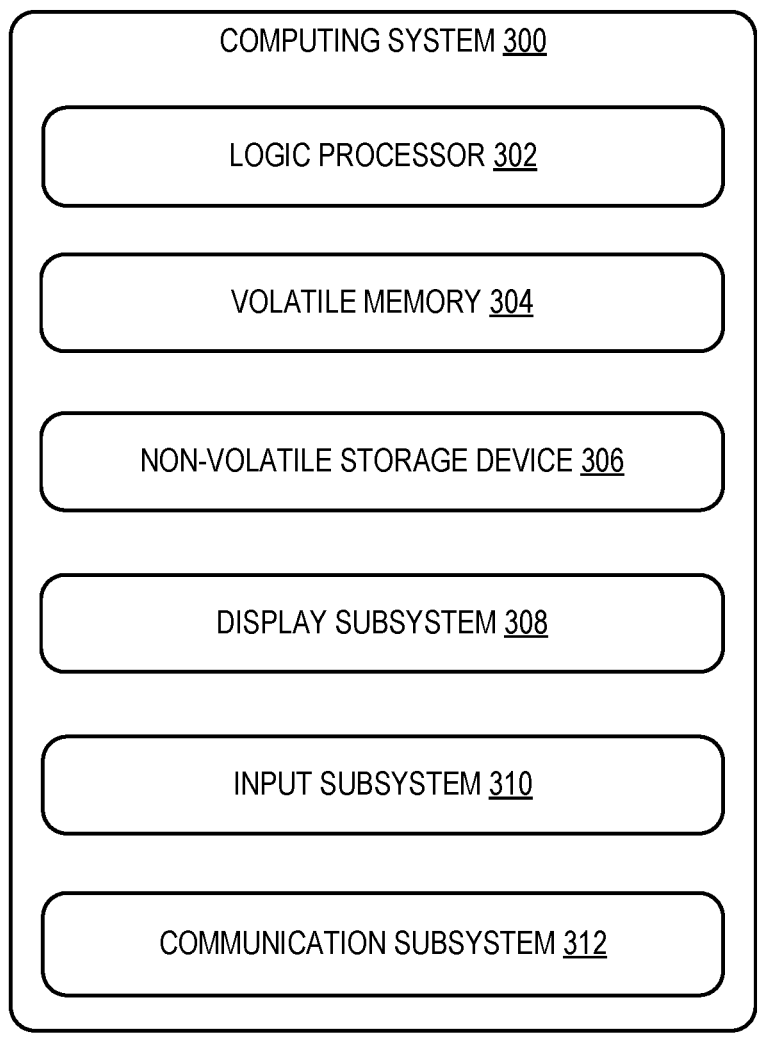
FIG. 6 is a schematic diagram illustrating an exemplary computing system that can be used to implement the modeling system of FIGS. 1-3.

FIG. 6 illustrates an exemplary computing system 300 that can be utilized to implement the system 10 and method 100 described above. Computing system 300 includes a logic processor 302, volatile memory 304, and a non-volatile storage device 306. Computing system 300 can optionally include a display subsystem 308, input subsystem 310, communication subsystem 312 connected to a computer network, and/or other components not shown in FIG. 6. These components are typically connected for data exchange by one or more data buses when integrated into single device, or by a combination of data buses, network data interfaces, and computer networks when integrated into separate devices connected by computer networks.

The non-volatile storage device 306 stores various instructions, also referred to as software, that are executed by the logic processor 302. Logic processor 302 includes one or more physical devices configured to execute the instructions. For example, the logic processor 302 can be configured to execute instructions that are part of one or more applications, programs, routines, libraries, objects, components, data structures, or other logical constructs. Such instructions can be implemented to perform a task, implement a data type, transform the state of one or more components, achieve a technical effect, or otherwise arrive at a desired result.

The logic processor 302 can include one or more physical processors (hardware) configured to execute software instructions. Additionally or alternatively, the logic processor 302 can include one or more hardware logic circuits or firmware devices configured to execute hardware-implemented logic or firmware instructions. Processors of the logic processor 302 can be single-core or multi-core, and the instructions executed thereon can be configured for sequential, parallel, and/or distributed processing. Individual components of the logic processor 302 optionally can be distributed among two or more separate devices, which can be remotely located and/or configured for coordinated processing. Aspects of the logic processor 302 can be virtualized and executed by remotely accessible, networked computing devices configured in a cloud-computing configuration. In such a case, these virtualized aspects are run on different physical logic processors of various different machines, it will be understood.

Non-volatile storage device 306 includes one or more physical devices configured to hold instructions executable by the logic processors to implement the methods and processes described herein. When such methods and processes are implemented, the state of non-volatile storage device 306 can be transformed—e.g., to hold different data.

Non-volatile storage device 306 can include physical devices that are removable and/or built-in. Non-volatile storage device 306 can include optical memory (e.g., CD, DVD, HD-DVD, Blu-Ray Disc, etc.), semiconductor memory (e.g., ROM, EPROM, EEPROM, FLASH memory, etc.), and/or magnetic memory (e.g., hard-disk drive, floppy-disk drive, tape drive, MRAM, etc.), or other mass storage device technology. Non-volatile storage device 306 can include nonvolatile, dynamic, static, read/write, read-only, sequential-access, location-addressable, file-addressable, and/or content-addressable devices. It will be appreciated that non-volatile storage device 306 is configured to hold instructions even when power is cut to the non-volatile storage device 306.

Volatile memory 304 can include physical devices that include random access memory. Volatile memory 304 is typically utilized by logic processor 302 to temporarily store information during processing of software instructions. It will be appreciated that volatile memory 304 typically does not continue to store instructions when power is cut to the volatile memory 304.

Aspects of logic processor 302, volatile memory 304, and non-volatile storage device 306 can be integrated together into one or more hardware-logic components. Such hardware-logic components can include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The terms "module," "program," and "engine" can be used to describe an aspect of the modeling system 10 typically implemented in software by a processor to perform a particular function using portions of volatile memory, which function involves transformative processing that specially configures the processor to perform the function. Thus, a module, program, or engine can be instantiated via logic processor 302 executing instructions held by non-volatile storage device 306, using portions of volatile memory 304. It will be understood that different modules, programs, and/or engines can be instantiated from the same application, service, code block, object, library, routine, API, function, etc. Likewise, the same module, program, and/or engine can be instantiated by different applications, services, code blocks, objects, routines, APIs, functions, etc. The terms "module," "program," and "engine" can encompass individual or groups of executable files, data files, libraries, drivers, scripts, database records, etc.

Display subsystem 308 typically includes one or more displays, which can be physically integrated with or remote from a device that houses the logic processor 302. Graphical output of the logic processor executing the instructions described above, such as a graphical user interface, is configured to be displayed on display sub system 308.

Input subsystem 310 typically includes one or more of a keyboard, pointing device (e.g., mouse, trackpad, finger operated pointer), touchscreen, microphone, and camera. Other input devices can also be provided.

Communication subsystem 312 is configured to communicatively couple various computing devices described herein with each other, and with other devices. Communication subsystem 312 can include wired and/or wireless communication devices compatible with one or more different communication protocols. As non-limiting examples, the communication subsystem can be configured for communication via a wireless telephone network, or a wired or wireless local- or wide-area network by devices such as a 3G, 4G, 5G, or 6G radio, WIFI card, ethernet network interface card, BLUETOOTH radio, etc. In some embodiments, the communication subsystem can allow computing system 10 to send and/or receive messages to and/or from other devices via a network such as the Internet. It will be appreciated that one or more of the computer networks via which communication subsystem 312 is configured to communicate can include security measures such as user identification and authentication, access control, malware detection, enforced encryption, content filtering, etc., and can be coupled to a wide area network (WAN) such as the Internet.

The subject disclosure includes all novel and non-obvious combinations and subcombinations of the various features and techniques disclosed herein. The various features and techniques disclosed herein are not necessarily required of all examples of the subject disclosure. Furthermore, the various features and techniques disclosed herein can define patentable subject matter apart from the disclosed examples and can find utility in other implementations not expressly disclosed herein.

To the extent that terms "includes," "including," "has," "contains," and variants thereof are used herein, such terms are intended to be inclusive in a manner similar to the term "comprises" as an open transition word without precluding any additional or other elements.

Further, the disclosure comprises configurations according to the following clauses.

Clause 1. A modeling system comprising: at least one processor, communicatively coupled to non-volatile memory storing a three-dimensional (3D) virtual model and instructions that, when executed by the processor, cause the processor to: retrieve a 3D virtual model of an object; extract an outer surface of the 3D virtual model, the outer surface including a plurality of faces; identify feature curves in each of the plurality of faces of the outer surface; generate a parameterized surface from the identified feature curves; and output the feature curves and the parameterized surface.

Clause 2. The modeling system of clause 1, wherein the instructions, when executed by the processor, further cause the processor to: generate a list of feature curve pairs that are adjacent to one another; obtain face pairs corresponding to the feature curve pairs; obtain a list of faces in the outer surface; add the list of faces to a connectivity graph mapping points in 3D space to the feature curves; compute normals for each pair of connected faces; and for each pair of connected faces, evaluate whether an angle difference between normals of the connected faces is greater than a predetermined threshold; and responsive to determining that the angle difference between the normals of the connected faces is greater than the predetermined threshold, extract a feature curve based on the pair of connected faces.

Clause 3. The modeling system of clause 1 or 2, wherein a spatial indexing scheme is used to generate the list of feature curve pairs that are adjacent to one another.

Clause 4. The modeling system of any of clauses 1 to 3, wherein, to generate the list of feature curve pairs that are adjacent to one another, for each feature curve pair: a principal axis of each feature curve is calculated; it is determined whether principal directions of the principal axes of the feature curves of the feature curve pair are aligned within a predetermined angle threshold; and responsive to determining that the principal directions of the principal axes of the feature curves of the feature curve pair are aligned within the predetermined angle threshold, the feature curve pair is added to the list of feature curve pairs that are adjacent to one another.

Clause 5. The modeling system of any of clauses 1 to 4, wherein, to generate the list of feature curve pairs that are adjacent to one another, for each feature curve pair: midpoints and end points of each feature curve are projected; it is determined whether the midpoints and the end points are separated within a predetermined distance; responsive to determining that the midpoints and the end points are separated within the predetermined distance, the feature curve pair is added to the list of feature curve pairs that are adjacent to one another.

Clause 6. The modeling system of any of clauses 1 to 5, wherein responsive to determining that the midpoints and the end points are separated within the predetermined distance, and the predetermined distance is greater than half the difference between the arc lengths of the feature curves of the feature curve pair, the feature curve pair is added to the list of feature curve pairs that are adjacent to one another.

Clause 7. The modeling system of any of clauses 1 to 6, wherein the connectivity graph maps the feature curves to the plurality of faces, and maps points in the 3D space to the feature curves.

Clause 8. The modeling system of any of clauses 1 to 7, wherein the processor is further configured to generate tiles based on the generated feature curves and the parameterized surface.

Clause 9. The modeling system of any of clauses 1 to 8, wherein feature curves with arc lengths longer than a predetermined minimum length are extracted from the plurality of faces.

Clause 10. The modeling system of any of clauses 1 to 9, wherein the extraction of feature curves includes the extraction of bounding boxes associated with the feature curves; and the bounding boxes represent a geometry of the plurality of faces.

Clause 11. A modeling method comprising steps to: extract an outer surface of the three-dimensional (3D) virtual model, the outer surface including a plurality of faces; identify feature curves in each of the plurality of faces of the outer surface; generate a parameterized surface from the identified feature curves; and output the feature curves and the parameterized surface.

Clause 12. The modeling method of clause 11, further comprising steps to: generate a list of feature curve pairs that are proximate or adjacent to one another; obtain face pairs corresponding to the feature curve pairs; obtain a list of faces in the outer surface; add the list of faces to a connectivity graph mapping points in 3D space to the feature curves; compute normals for each pair of connected faces; and for each pair of connected faces, evaluate whether an angle difference between normals of the connected faces is greater than a predetermined threshold; and responsive to determining that the angle difference between the normals of the connected faces is greater than the predetermined threshold, extract a feature curve based on the pair of connected faces.

Clause 13. The modeling method of clause 11 or 12, wherein a spatial indexing scheme is used to generate the list of feature curve pairs that are proximate or adjacent to one another.

Clause 14. The modeling method of any of clauses 11 to 13, wherein, to generate the list of feature curve pairs that are adjacent to one another, for each feature curve pair: a principal axis of each feature curve is calculated; it is determined whether principal directions of the principal axes of the feature curves of the feature curve pair are aligned within a predetermined angle threshold; and responsive to determining that the principal directions of the principal axes of the feature curves of the feature curve pair are aligned within the predetermined angle threshold, the feature curve pair is added to the list of feature curve pairs that are adjacent to one another.

Clause 15. The modeling method of any of clauses 11 to 14, wherein, to generate the list of feature curve pairs that are adjacent to one another, for each feature curve pair: midpoints and end points of each feature curve are projected; it is determined whether the midpoints and the end points are separated within a predetermined distance; responsive to determining that the midpoints and the end points are separated within the predetermined distance, the feature curve pair is added to the list of feature curve pairs that are adjacent to one another.

Clause 16. The modeling method of any of clauses 11 to 15, wherein responsive to determining that the midpoints and the end points are separated within the predetermined distance, and the predetermined distance is greater than half the difference between the arc lengths of the feature curves of the feature curve pair, the feature curve pair is added to the list of feature curve pairs that are adjacent to one another.

Clause 17. The modeling method of any of clauses 11 to 16, wherein the connectivity graph maps the feature curves to the plurality of faces, and maps points in the 3D space to the feature curves.

Clause 18. The modeling method of any of clauses 11 to 17, further comprising generating tiles based on the generated feature curves and the parameterized surface.

Clause 19. The modeling method of any of clauses 11 to 18, wherein the extraction of feature curves includes the extraction of bounding boxes associated with the feature curves; and the bounding boxes represent a geometry of the plurality of faces.

Clause 20. A modeling system comprising: at least one processor, communicatively coupled to non-volatile memory storing a three-dimensional (3D) virtual model and instructions that, when executed by the processor, cause the processor to: retrieve a 3D virtual model of an object; extract an outer surface of the 3D virtual model, the outer surface including a plurality of faces; identify feature curves and bounding boxes of the feature curves from the plurality of faces of the outer surface; generate a list of feature curve pairs that are adjacent to one another; obtain face pairs corresponding to the feature curve pairs; compute normals for each pair of connected faces; for each pair of connected faces, evaluate whether an angle difference between normals of the connected faces is greater than a predetermined threshold; and responsive to determining that the angle difference between the normals of the connected faces is greater than the predetermined threshold, extract a feature curve based on the pair of connected faces; generate a parameterized surface from the generated feature curves; and output the feature curves and the parameterized surface.

The invention claimed is:

1. A modeling system comprising:
at least one processor, communicatively coupled to non-volatile memory storing a three-dimensional (3D) virtual model and instructions that, when executed by the processor, cause the processor to:
retrieve a 3D virtual model of an object;
extract an outer surface of the 3D virtual model, the outer surface including a plurality of faces;
identify feature curves in each of the plurality of faces of the outer surface, wherein identifying the feature curves includes:
generating a list of feature curve pairs that are adjacent to one another;
obtaining face pairs corresponding to the feature curve pairs;
obtaining a list of faces in the outer surface;
adding the list of faces to a connectivity graph mapping points in 3D space to the feature curves;
computing normals for each pair of connected faces; and
for each pair of connected faces,
evaluating whether an angle difference between normals of the connected faces is greater than a predetermined threshold; and
responsive to determining that the angle difference between the normals of the connected faces is greater than the predetermined threshold, extracting a feature curve based on the pair of connected faces;
generate a parameterized surface from the identified feature curves; and
output the feature curves and the parameterized surface.

2. The modeling system of claim 1, wherein a spatial indexing scheme is used to generate the list of feature curve pairs that are adjacent to one another.

3. The modeling system of claim 1, wherein, to generate the list of feature curve pairs that are adjacent to one another, for each feature curve pair:
a principal axis of each feature curve is calculated;
it is determined whether principal directions of the principal axes of the feature curves of the feature curve pair are aligned within a predetermined angle threshold; and
responsive to determining that the principal directions of the principal axes of the feature curves of the feature curve pair are aligned within the predetermined angle threshold, the feature curve pair is added to the list of feature curve pairs that are adjacent to one another.

4. The modeling system of claim 1, wherein, to generate the list of feature curve pairs that are adjacent to one another, for each feature curve pair:
midpoints and end points of each feature curve are projected;
it is determined whether the midpoints and the end points are separated within a predetermined distance;
responsive to determining that the midpoints and the end points are separated within the predetermined distance, the feature curve pair is added to the list of feature curve pairs that are adjacent to one another.

5. The modeling system of claim 4, wherein responsive to determining that the midpoints and the end points are separated within the predetermined distance, and the predetermined distance is greater than half the difference between the arc lengths of the feature curves of the feature curve pair, the feature curve pair is added to the list of feature curve pairs that are adjacent to one another.

6. The modeling system of claim 1, wherein the connectivity graph maps the feature curves to the plurality of faces, and maps points in the 3D space to the feature curves.

7. The modeling system of claim 1, wherein the processor is further configured to generate tiles based on the generated feature curves and the parameterized surface.

8. The modeling system of claim 1, wherein feature curves with arc lengths longer than a predetermined minimum length are extracted from the plurality of faces.

9. The modeling system of claim 1, wherein
the extraction of feature curves includes the extraction of bounding boxes associated with the feature curves; and
the bounding boxes represent a geometry of the plurality of faces.

10. A modeling method comprising steps to:
extract an outer surface of the three-dimensional (3D) virtual model, the outer surface including a plurality of faces;
identify feature curves in each of the plurality of faces of the outer surface;
generate a list of feature curve pairs that are proximate or adjacent to one another;
obtain face pairs corresponding to the feature curve pairs;
obtain a list of faces in the outer surface;
add the list of faces to a connectivity graph mapping points in 3D space to the feature curves;
compute normals for each pair of connected faces; and
for each pair of connected faces,
evaluate whether an angle difference between normals of the connected faces is greater than a predetermined threshold; and
responsive to determining that the angle difference between the normals of the connected faces is greater than the predetermined threshold, extract a feature curve based on the pair of connected faces;
generate a parameterized surface from the identified feature curves; and
output the feature curves and the parameterized surface.

11. The modeling method of claim 10, wherein a spatial indexing scheme is used to generate the list of feature curve pairs that are proximate or adjacent to one another.

12. The modeling method of claim 10, wherein, to generate the list of feature curve pairs that are adjacent to one another, for each feature curve pair:
a principal axis of each feature curve is calculated;
it is determined whether principal directions of the principal axes of the feature curves of the feature curve pair are aligned within a predetermined angle threshold; and
responsive to determining that the principal directions of the principal axes of the feature curves of the feature curve pair are aligned within the predetermined angle threshold, the feature curve pair is added to the list of feature curve pairs that are adjacent to one another.

13. The modeling method of claim 10, wherein, to generate the list of feature curve pairs that are adjacent to one another, for each feature curve pair:
midpoints and end points of each feature curve are projected;
it is determined whether the midpoints and the end points are separated within a predetermined distance;
responsive to determining that the midpoints and the end points are separated within the predetermined distance, the feature curve pair is added to the list of feature curve pairs that are adjacent to one another.

14. The modeling method of claim 13, wherein responsive to determining that the midpoints and the end points are separated within the predetermined distance, and the predetermined distance is greater than half the difference between the arc lengths of the feature curves of the feature curve pair, the feature curve pair is added to the list of feature curve pairs that are adjacent to one another.

15. The modeling method of claim 10, wherein the connectivity graph maps the feature curves to the plurality of faces, and maps points in the 3D space to the feature curves.

16. The modeling method of claim 10, further comprising generating tiles based on the generated feature curves and the parameterized surface.

17. The modeling method of claim 10, wherein
the extraction of feature curves includes the extraction of bounding boxes associated with the feature curves; and
the bounding boxes represent a geometry of the plurality of faces.

18. A modeling system comprising:
at least one processor, communicatively coupled to non-volatile memory storing a three-dimensional (3D) virtual model and instructions that, when executed by the processor, cause the processor to:
retrieve a 3D virtual model of an object;
extract an outer surface of the 3D virtual model, the outer surface including a plurality of faces;
identify feature curves and bounding boxes of the feature curves from the plurality of faces of the outer surface;
generate a list of feature curve pairs that are adjacent to one another;
obtain face pairs corresponding to the feature curve pairs;
compute normals for each pair of connected faces;
for each pair of connected faces,
evaluate whether an angle difference between normals of the connected faces is greater than a predetermined threshold; and
responsive to determining that the angle difference between the normals of the connected faces is greater than the predetermined threshold, extract a feature curve based on the pair of connected faces;

generate a parameterized surface from the generated feature curves; and output the feature curves and the parameterized surface.

\* \* \* \* \*